United States Patent
Danello et al.

(10) Patent No.: US 8,508,943 B2
(45) Date of Patent: Aug. 13, 2013

(54) COOLING ACTIVE CIRCUITS (75) Inventors: Paul A. Danello, Franklin, MA (US); Scott R. Cheyne, Brookline, NH (US); Joseph R. Ellsworth, Worcester, MA (US); Thomas J. Tellinghuisen, Pelham, NH (US)

(73) Assignee: Raytheon Company, Waltham, MA (US)

( * ) Notice: Subject to any disclaimer, the term of this patent is extended or adjusted under 35 U.S.C. 154(b) by 495 days.

(21) Appl. No.: 12/580,356

(22) Filed: Oct. 16, 2009

(65) Prior Publication Data
US 2012/0146862 A1 Jun. 14, 2012

(51) Int. Cl.
*H05K 7/20* (2006.01)
*H01Q 1/38* (2006.01)

(52) U.S. Cl.
USPC . 361/704; 361/688; 361/679.01; 343/700 MS (58) Field of Classification Search
USPC .................. 343/700 MS; 361/702, 704, 708, 361/688, 696, 697, 679.01
See application file for complete search history.

(56) References Cited

U.S. PATENT DOCUMENTS

| | | |
|---|---|---|
| 3,091,743 A | 5/1963 | Wilkinson |
| 3,665,480 A | 5/1972 | Fassett |
| 4,489,363 A | 12/1984 | Goldberg |
| 4,527,165 A | 7/1985 | deRonde |
| 4,698,663 A | 10/1987 | Sugimoto et al. |
| 4,706,094 A | 11/1987 | Kubick |
| 4,751,513 A | 6/1988 | Daryoush et al. |
| 4,835,658 A | 5/1989 | Bonnefoy |
| 5,005,019 A | 4/1991 | Zaghloul et al. |
| 5,055,852 A | 10/1991 | Dusseux et al. |
| 5,099,254 A | 3/1992 | Tsukii et al. |
| 5,276,455 A | 1/1994 | Fitzsimmons et al. |
| 5,398,010 A | 3/1995 | Klebe |
| 5,400,040 A | 3/1995 | Lane et al. |
| 5,404,148 A | 4/1995 | Zwarts |
| 5,451,969 A | 9/1995 | Toth et al. |
| 5,459,474 A | 10/1995 | Mattioli et al. |
| 5,488,380 A | 1/1996 | Harvey et al. |

(Continued)

FOREIGN PATENT DOCUMENTS

| | | |
|---|---|---|
| EP | 0 481 417 A | 4/1992 |
| EP | 1 764 863 A1 | 3/2007 |

(Continued)

OTHER PUBLICATIONS

Div. Application (with translation of amended claims) as filed on Dec. 1, 2008 in Korean Intellectual Property Office and assigned App. No. 10-2008-7029396.

(Continued)

*Primary Examiner* — Dieu H Duong
(74) *Attorney, Agent, or Firm* — Daly, Crowley, Mofford & Durkee, LLP (57) ABSTRACT In one aspect, an assembly includes a panel that includes a first surface. The panel also includes a first active circuit coupled to the first surface of the panel and a cold plate having a first bore. The cold plate includes a first inner surface exposed by the first bore. The panel further includes a first thermally conductive material in contact with the first inner surface of the cold plate and the first active circuit.

15 Claims, 6 Drawing Sheets

(56) References Cited

U.S. PATENT DOCUMENTS

| | | | |
|---|---|---|---|
| 5,493,305 A | 2/1996 | Wooldridge et al. | |
| 5,563,613 A | 10/1996 | Schroeder et al. | |
| 5,592,363 A | 1/1997 | Atarashi et al. | |
| 5,646,826 A | 7/1997 | Katchmar | |
| 5,675,345 A | 10/1997 | Pozgay et al. | |
| 5,724,048 A | 3/1998 | Remondiere | |
| 5,786,792 A | 7/1998 | Bellus et al. | |
| 5,796,582 A * | 8/1998 | Katchmar | 361/704 |
| 5,854,607 A | 12/1998 | Kinghorn | |
| 5,862,038 A * | 1/1999 | Suzuki et al. | 361/704 |
| 5,907,304 A | 5/1999 | Wilson et al. | |
| 6,011,507 A | 1/2000 | Curran et al. | |
| 6,037,903 A | 3/2000 | Lange et al. | |
| 6,061,027 A | 5/2000 | Legay et al. | |
| 6,078,289 A | 6/2000 | Manoogian et al. | |
| 6,087,988 A | 7/2000 | Pozgay | |
| 6,091,373 A | 7/2000 | Raguenet | |
| 6,104,343 A | 8/2000 | Brookner et al. | |
| 6,127,985 A | 10/2000 | Guler | |
| 6,166,705 A | 12/2000 | Mast et al. | |
| 6,181,280 B1 | 1/2001 | Kadambi et al. | |
| 6,184,832 B1 * | 2/2001 | Geyh et al. | 343/700 MS |
| 6,208,316 B1 | 3/2001 | Cahill | |
| 6,211,824 B1 | 4/2001 | Holden et al. | |
| 6,212,074 B1 * | 4/2001 | Gonsalves et al. | 361/717 |
| 6,218,214 B1 | 4/2001 | Panchou et al. | |
| 6,222,493 B1 | 4/2001 | Caille et al. | |
| 6,225,695 B1 | 5/2001 | Chia et al. | |
| 6,297,775 B1 | 10/2001 | Haws et al. | |
| 6,388,620 B1 | 5/2002 | Bhattacharyya | |
| 6,392,890 B1 * | 5/2002 | Katchmar | 361/705 |
| 6,424,313 B1 | 7/2002 | Navarro et al. | |
| 6,480,167 B2 | 11/2002 | Matthews | |
| 6,483,705 B2 | 11/2002 | Snyder et al. | |
| 6,611,180 B1 | 8/2003 | Puzella et al. | |
| 6,621,470 B1 | 9/2003 | Boeringer et al. | |
| 6,624,787 B2 | 9/2003 | Puzella et al. | |
| 6,661,376 B2 | 12/2003 | Maceo et al. | |
| 6,670,930 B2 | 12/2003 | Navarro | |
| 6,686,885 B1 | 2/2004 | Barkdoll et al. | |
| 6,703,976 B2 | 3/2004 | Jacomb-Hood et al. | |
| 6,711,814 B2 | 3/2004 | Barr et al. | |
| 6,731,189 B2 | 5/2004 | Puzella et al. | |
| 6,756,684 B2 | 6/2004 | Huang | |
| 6,856,210 B2 | 2/2005 | Zhu et al. | |
| 6,900,765 B2 | 5/2005 | Navarro et al. | |
| 6,943,330 B2 | 9/2005 | Ring | |
| 6,961,248 B2 | 11/2005 | Vincent et al. | |
| 6,995,322 B2 | 2/2006 | Chan et al. | |
| 7,030,712 B2 | 4/2006 | Brunette et al. | |
| 7,061,446 B1 | 6/2006 | Short, Jr. et al. | |
| 7,129,908 B2 | 10/2006 | Edward et al. | |
| 7,132,990 B2 | 11/2006 | Stenger et al. | |
| 7,180,745 B2 | 2/2007 | Mandel et al. | |
| 7,187,342 B2 | 3/2007 | Heisen et al. | |
| 7,348,932 B1 | 3/2008 | Puzella et al. | |
| 7,417,598 B2 | 8/2008 | Navarro et al. | |
| 7,443,354 B2 | 10/2008 | Navarro et al. | |
| 7,444,737 B2 | 11/2008 | Worl | |
| 7,489,283 B2 | 2/2009 | Ingram et al. | |
| 7,508,338 B2 | 3/2009 | Pluymers et al. | |
| 7,597,534 B2 | 10/2009 | Hopkins | |
| 2002/0051342 A1 | 5/2002 | Kanada | |
| 2005/0110681 A1 | 5/2005 | Londre | |
| 2005/0151215 A1 | 7/2005 | Hauhe et al. | |
| 2006/0268518 A1 | 11/2006 | Edward et al. | |
| 2007/0152882 A1 | 7/2007 | Hash et al. | |
| 2008/0074324 A1 | 3/2008 | Puzella et al. | |
| 2008/0106467 A1 | 5/2008 | Navarro et al. | |
| 2008/0106482 A1 | 5/2008 | Cherrette et al. | |
| 2008/0150832 A1 | 6/2008 | Ingram et al. | |
| 2008/0316139 A1 | 12/2008 | Blaser et al. | |
| 2011/0103020 A1 * | 5/2011 | Dangelo et al. | 361/709 |

FOREIGN PATENT DOCUMENTS

| | | | |
|---|---|---|---|
| EP | 1 436 859 B1 | 8/2007 | |
| EP | 1 978 597 A1 | 10/2008 | |
| JP | 61 224504 A | 10/1986 | |
| JP | 4-122107 A | 4/1992 | |
| JP | 06-097710 | 4/1994 | |
| JP | 7-21215 | 8/1995 | |
| JP | 2000-138525 A | 5/2000 | |
| JP | 2003179429 A | 6/2003 | |
| JP | 2005 505963 | 2/2005 | |
| KR | 1020010079872 A | 8/2001 | |
| WO | WO 98/26642 | 6/1998 | |
| WO | WO 99/66594 | 12/1999 | |
| WO | WO 01/06821 A1 | 1/2001 | |
| WO | WO 01/20720 A1 | 3/2001 | |
| WO | WO 01/33927 A1 | 5/2001 | |
| WO | WO 01/41257 A1 | 6/2001 | |
| WO | WO 03/003031 A1 | 4/2003 | |
| WO | WO 2007/136941 A2 | 11/2007 | |
| WO | WO 2007/136941 A3 | 11/2007 | |
| WO | WO 2008/010851 A2 | 1/2008 | |
| WO | WO 2008/010851 A3 | 1/2008 | |
| WO | WO 2008/036469 A1 | 3/2008 | |

OTHER PUBLICATIONS

Decision of Rejection dated Jul. 30, 2008 from KR Pat. App. No. 10-2004-7003900.
Notice of Trial Decision dated Mar. 23, 2010 from KR Pat. App. No. 10-2004-7003900.
EP Search Report for 06021905.2; dated Feb. 9, 2007; 8 pages.
European Office Action dated Nov. 3, 2005 from EP Pat. App. No. 02800372.1.
Response to European Office Action filed Jan. 12, 2007 from EP Pat. App. No. 02800372.1.
European Office Action dated Oct. 18, 2007 from EPO Pat. App. No. 06021905.2.
Response to European Office Action dated Oct. 18, 2007 filed in the EPO on Aug. 11, 2008 from EP Pat. App. No. 06021905.2.
Response to European Office Action dated Mar. 19, 2009 filed in the EPO on Nov. 19, 2009 from EP Pat. App. No. 06021905.2.
European Office Action dated Feb. 18, 2010 from EPO Pat. App. No. 06021905.2.
Notice of Allowance dated Feb. 2, 2007 from EP Pat. App. No. 02800372.1.
Korean Office Action dated Oct. 31, 2007 from KR Pat. App. No. 10-2004-7003900.
Response to Korean Office Action filed Mar. 26, 2008 from KR Pat. App. No. 10-2004-7003900.
Korean Office Action dated Feb. 25, 2009 from KR Pat. App. No. 10-2008-7029396.
Korean Office Action dated Nov. 27, 2009 from KR Pat. App. No. 10-2008-7029396.
Japanese Office Action dated Mar. 7, 2007 from JP Pat. App. No. 2003-533378.
Japanese Office Action dated Feb. 15, 2008 from JP Pat. App. No. 2003-533378.
Japanese Office Action dated Feb. 18, 2009 from JP Pat. App. No. 2003-533378.
Response to Japanese Office Action filed Jul. 5, 2007 from JP App. No. 2003-533378.
Response to Japanese Office Action filed Jun. 19, 2009 from App JP App. No. 2003-533378.
PCT Search Report of the ISA for PCT/US2010/026861 dated Jun. 18, 2010; 6 pages.
PCT Written Opinion of the ISA for PCT/US2010/026861 dated Jun. 18, 2010; 5 pages.
Office Action dated Jun. 11, 2010 from U.S. Appl. No. 12/694,450.
Response to Office Action of Jun. 11, 2010 from U.S. Appl. No. 12/694,450 dated Sep. 21, 2010.
Notice of Allowance dated Nov. 3, 2010 from U.S. Appl. No. 12/482,061.
Office Action dated Dec. 1, 2010 from U.S. Appl. No. 12/694,450.

Notification of International Search Report and Written Opinion of the International Searching Authority for PCT/US2010/049261, dated Feb. 7, 2011, 11 pages.
Response to Office Action of Dec. 1, 2010 from U.S. Appl. No. 12/694,450 dated Jan. 25, 2011, 11 pages.
"S-band Modular Integrated Panel (S-MIP) Radar;" Proposal White Paper; copyright 2007 Raytheon Company; 17 pages.
Carter; "'Fuzz Button' interconnects and microwave and mm-wave frequencies;" IEEE Seminar, London, UK; Mar. 1-7, 2000; 7 pages.
Jerinic et al.; "X-Band "Tile" Array for Mobil Radar;" internal Raytheon Company publication; Spring 2003; 4 pages.
Puzella et al.; "Digital Subarray for Large Apertures;" slide presentation; internal Raytheon Company publication; Spring 2003; pp. 1-22.
Puzella et al.; "Radio Frequency Interconnect Circuits and Techniques;" U.S. Appl. No. 11/558,126, filed Nov. 9, 2006; 57 pages.
Puzella et al.; "X-Band Tile Sub-Array;" slide presentation; internal Raytheon Company publication; Spring 2003; 28 pages.
Puzella; "Deliverable Demonstration Sub-Array;" slide presentation; internal Raytheon Company publication; Fall 2003; pp. 1-17.
PCT International Preliminary Examination Report and Written Opinion of the ISA for PCT/US2002/30677 dated Nov. 27, 2003; 10 pages.
PCT International Preliminary Examination Report and Written Opinion of the ISA for PCT/US2007/074795 dated Apr. 2, 2009; 7pages.
PCT Search Report of the ISA for PCT/US2007/074795 dated Dec. 19, 2007; 5 pages.
PCT Written Opinion of the ISA for PCT/US2007/074795 dated Dec. 19, 2007; 5 pages.
Bash et al,; "Improving Heat Transfer From a Flip-Chip Package;" Technology Industry; Email Alert RSS Feed; Hewlett-Packard Journal, Aug. 1997; 3 pages.
Marsh et al.; "5.4 Watt GaAs MESFET MMIC for Phased Array Radar Systems;" 1997 Workshop on High Performance Electron Devices for Microwave and Optoelectronic Applications, Nov. 24-25, 1997; pp. 169-174.
U.S. Appl. No. 12/484,626, filed Jun. 15, 2009.
U.S. Appl. No. 12/482,061, filed Jun. 10, 2009.
U.S. Appl. No. 12/566,818, filed Sep. 25, 2009.
U.S. Appl. No. 12/484,626, Angelo M. Puzella, et al., filed Jun. 15, 2009, 100 pages.
U.S. Appl. No. 12/482,061, Angelo M. Puzella, et al., filed Jun. 10, 2009, 50 pages.
U.S. Appl. No. 12/566,818, Jeffrey Paquette, et al., filed Sep. 25, 2009, 47 pages.
U.S. Appl. No. 61/163,002, Angelo M. Puzella, filed Mar. 24, 2009, 82 pages.

* cited by examiner

COOLING ACTIVE CIRCUITS

BACKGROUND

As is known in the art, a phased array antenna includes a plurality of antenna elements spaced apart from each other by known distances. Each of the antenna elements are coupled through a plurality of phase shifter circuits, amplifier circuits and/or other circuits to either or both of a transmitter or receiver. In some cases, the phase shifter, amplifier circuits and other circuits (e.g., mixer circuits) are provided in a so-called transmit/receive (T/R) module and are considered to be part of the transmitter and/or receiver.

The phase shifters, amplifier and other circuits (e.g., T/R modules) often require an external power supply (e.g., a DC power supply) to operate correctly. Thus, the circuits are referred to as "active circuits" or "active components." Accordingly, phased array antennas which include active circuits are often referred to as "active phased arrays."

Active circuits dissipate power in the form of heat. High amounts of heat can cause active circuits to be inoperable. Thus, active phased arrays must be cooled. In one example heat-sink(s) are attached to each active circuit.

SUMMARY

In one aspect, an assembly includes a panel that includes a first surface. The panel also includes a first active circuit coupled to the first surface of the panel and a cold plate having a first bore. The cold plate includes a first inner surface exposed by the first bore. The panel further includes a first thermally conductive material in contact with the first inner surface of the cold plate and the first active circuit.

In another aspect, a method to provide thermal cooling to active circuits includes disposing a thermally conductive material in bores of a cold plate, enabling the thermally conductive material to cover a substantial portion of top surfaces of the active circuits and providing a thermal path from the top surfaces of the active circuits to inner surfaces of the cold plate formed by the bores using the then tally conductive material.

In a further aspect, an active, electronically scanned array (AESA) panel architecture system includes an antenna panel, an active panel coupled to the antenna panel and comprising a first surface and active circuits coupled to the first surface of the active panel. The system also includes a cold plate that includes bores and inner surfaces exposed by the bores. The system further includes thermally conductive material in contact with the inner surfaces of the cold plate and the active circuits. A first active circuit of the active circuits and a second active circuit of the active circuits differ in thickness of greater than 1 mil.

DETAILED DESCRIPTION

Cooling a number of substantially coplanar active circuits (e.g., integrated circuits) with a cold plate in direct contact with top surfaces of the active circuits is difficult because of the many tolerances that exist resulting from height variations of the active circuits. For example, the active circuits may have different thicknesses. In another example, the board for which the active circuits are affixed may have a bow or may be twisted. Even a bow in the board or a difference in thicknesses amongst the active circuits of a few mils makes placement of a single cold plate (also called a heat spreader or heat spreader plate) on top of these active circuits difficult because the cold plate may not be in direct contact with all the active circuits much less the entire top surface area of each of the active circuits; thus preventing efficient heat transfer. As described herein, a cold plate that includes bores corresponding to an active circuit along with a thermally conductive material disposed within the bores and in contact with both the active circuit and the cold plate provide a thermal path to remove heat from the active circuits. While this disclosure describes cooling active circuits in an environment of an active, electronically scanned array (AESA) panel architecture system, the techniques described herein may be used in any environment to cool active circuits.

Figure 1:
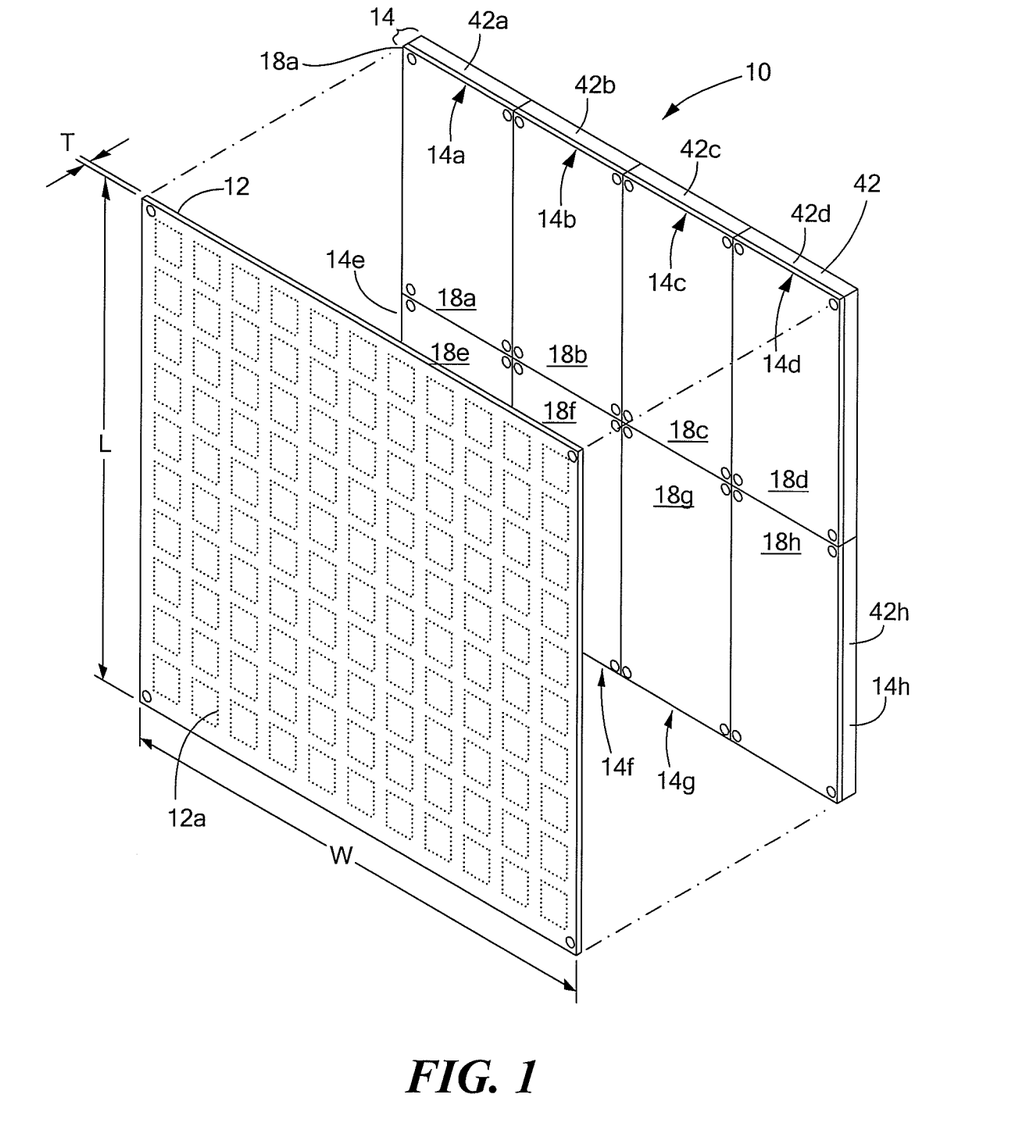
FIG. 1 is an isometric view of an active, electronically scanned array (AESA) having a panel architecture.

Referring to FIG. 1, an AESA 10 is a panel architecture. The AESA includes an antenna panel 12 coupled to an integrated panel array assembly (IPAA) 14. Antenna panel 12 is thin and generally planar and has a plurality of antenna elements generally denoted 13, disposed to transmit and receive RF energy through a first surface 12a thereof. Antenna elements 13 are shown in phantom since they are typically below external surface 12a and thus not directly visible in FIG. 1.

In one example, the antenna panel 12 may be provided as a stacked patch antenna panel configured for operation in the X-band frequency range and having a thickness, T in the range of about 0.1 inches to about 0.4 inches (with a thickness typically of about 0.2 inches being preferred) and having a width, W, of about 0.5 meters and a length, L, of about 0.5 m with 1024 patch antenna elements (not all shown visible in FIG. 1).

In another example of FIG. 1, the IPAA 14 is provided from eight subassemblies 14a-14h. Each of the eight subassemblies 14a-14h are mechanically coupled together. Each of the subassemblies 14a-14h include a corresponding one of eight active panels 18a-18h and a corresponding one of eight cold plates 42a-42h (cold plates 42e-42g are not shown). The cold plates 42a-42h cool corresponding ones of the active panels 18a-18h. The cold plates 42a-42h may be may be air cooled or liquid cooled or both. Each of active panels 18a-18h are electrically coupled to antenna panel 12 via a first surface 32 (FIG. 3) thereof. A second surface (not visible) of active panels 18a-18h have active circuits (not visible in FIG. 1) disposed thereon.

In one exemplary embodiment, the AESA 10 comprises eight subassemblies 14a-14h in one 0.5 meter×0.5 meter (0.5 m×0.5 m) assembly (i.e., L=0.5 m and W=0.5 m in FIG. 1). In other embodiments, fewer or more than eight subassemblies 14a-14h may be used to provide an AESA. Also, the AESA may be provided having sizes other than 0.5 m×0.5 m. One of ordinary skill in the art will appreciate how to select the number of subassemblies to include in an AESA as well as the length, L, and width, W, required for a particular application.

Since the subassemblies 14a-14h are mechanically independent, they are sometimes referred to as line replaceable units (LRUs) which indicates that if one of subassemblies 14a-14h were to fail or begin to operate incorrectly or with degraded performance, the subassembly could be removed and a new subassembly could be inserted in its place.

By appropriate selection of the active components coupled thereto, the active panels 18a-18h may be configured to provide a wide range of RF power levels and radar waveforms including short and long transmit pulses at multiple pulse repetition frequencies (PRFs). Different power levels are achieved by appropriate selection of the active components provided as part of the active panels 18a-18h. In some examples, monolithic microwave integrated circuit (MMIC) technologies are preferred and can be used to provide systems which operate with relatively low power T/R channels (e.g., less than about 1 watt (W) per T/R channel). Also, MMIC may be implemented using flip-chip attached circuits in the active panels 18a-18h to provide low power per T/R Channels. Also, flip-chip attached SiGe or RF (radio frequency) CMOS (complementary metal oxide semiconductor) circuits may be used in the active panels 18a-18h to achieve medium power channels (e.g., in the range of about 1 W to about 10 W per T/R transmit channel). Also, flip-chip circuits may be used in the active panels 18a-18h to provide high power channels. It should thus be appreciated that one panel architecture can handle T/R channel RF output peak power from milli-watts (mW) to tens of watts and average power from mW to watts. Thus, by populating the active panels 18a-18h with different types of active circuits (e.g., different types of ICs), the active panels 18a-18h may be appropriate for use in different types of radar or other RF systems.

The IPAA 14 described herein efficiently transfers heat (i.e., thermal energy) from the active panel 18 (and in particular from active circuits 35 (FIG. 3)) mounted on the active panels) to the cold plate 42. Mounting the cold plate 42 directly to the active circuits 35 would reduce the number of thermal interfaces between the active circuits and the cold plate. However, due to the varying thickness of the active circuits 35 and bows in the active panel 18 for which the active circuits 35 are attached as well as bows in the cold plate 42 itself, interfacing each and every active circuit is difficult. Therefore, an IPAA 14 that mitigates these variances and provides a thermal interface between the active circuits 35 and the cold plate 42 allows for an efficient transfer of dissipated thermal energy from the active circuits. As will be described further, a thermally conductive material 62 connecting the active circuits 35 with the cold plate 42 allows for efficient transfer of heat from the active circuits.

Figure 2:
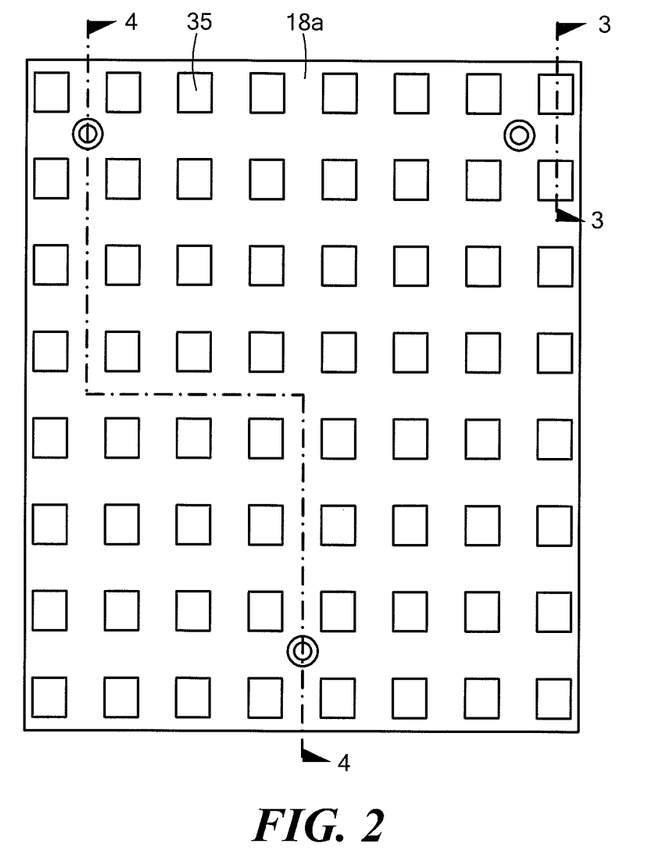
FIG. 2 is a view of a subassembly without a cold plate and depicting the active panel with integrated circuits (ICs).

FIG. 2 shows an example of one of the subassemblies, a subassembly 14a, without the cold plate 42a. FIG. 2 also shows the active panel 18a that includes active circuits 35.

Figure 3:
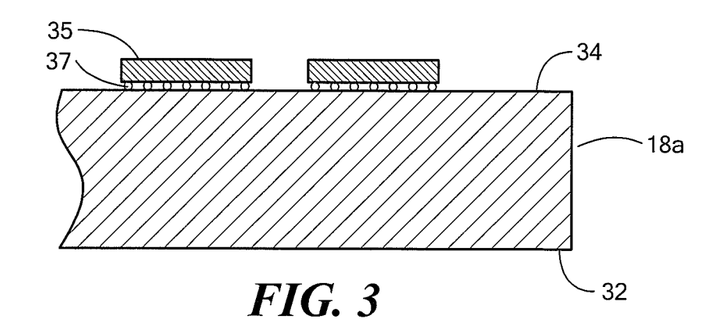
FIG. 3 is a cross-sectional view of the active panel of FIG. 2 taken along lines 3-3.

Referring to FIG. 3, the active circuits 35 (e.g., ICs) are mounted on an external surface 34 of the active panel 18a. In one example, the active circuits 35 are MMICs in the form of flip chips that are soldered via a ball grid array (BGA) 37 to the surface 34 of active panel 18a (e.g., using a solder re-flow operation).

FIGS. 4A-4D depict the processing stages to form a subassembly 14a. For example, the cold plate 42a includes bores 44. The bores 44 are aligned over the active circuits 35. In one example, the bores 44 are chamfered to ease automated assembly (chamfers are not shown). The cold plate 42a is separated from the active panel 18a and the active circuits 35 by standoffs 40. The standoffs 40 ensure that the spacing between the active panel 18a and the cold plate 42a is fixed. The cold plate 42a is held secure to the active panel 18a through the use of fasteners 52 (e.g., screws, bolts and so forth). The fasteners 52 pass through the standoffs 40. In one example, there are at least three fasteners 52 and at least three corresponding standoffs 40 to ensure a robust connection without allowing the cold plate 42a to bend and conform to the shape of the active panel 18a. It also prevents the active panel 18a from bending to conform to the shape of the cold plate 42a, eliminating the risk of damaging active circuits 35 and solder joints (e.g., BGA assembly 37). The fastener/standoff arrangement prevents the force provided from the fasteners 52 to transfer to the MMICs and possibly damaging the MMICs. Thus, the standoffs 40 prevent the cold plate 42a from bowing to match the contour of the active panel 18 and maintain a relatively flat surface to mate to a next higher assembly (not shown).

Figure 4A:
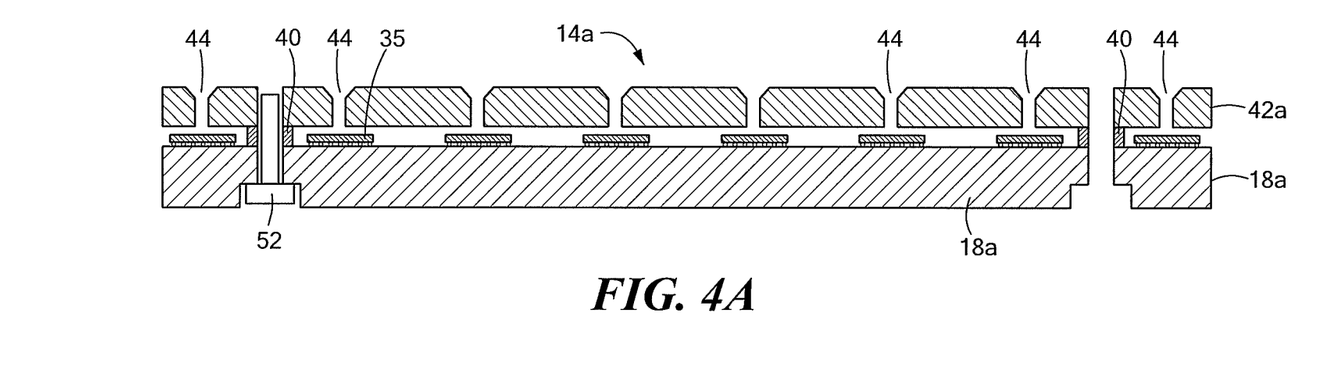
FIGS. 4A to 4D are different views of the formation of the subassembly of FIG. 2 including the cold plate taken along lines 4-4.
Figure 4B:
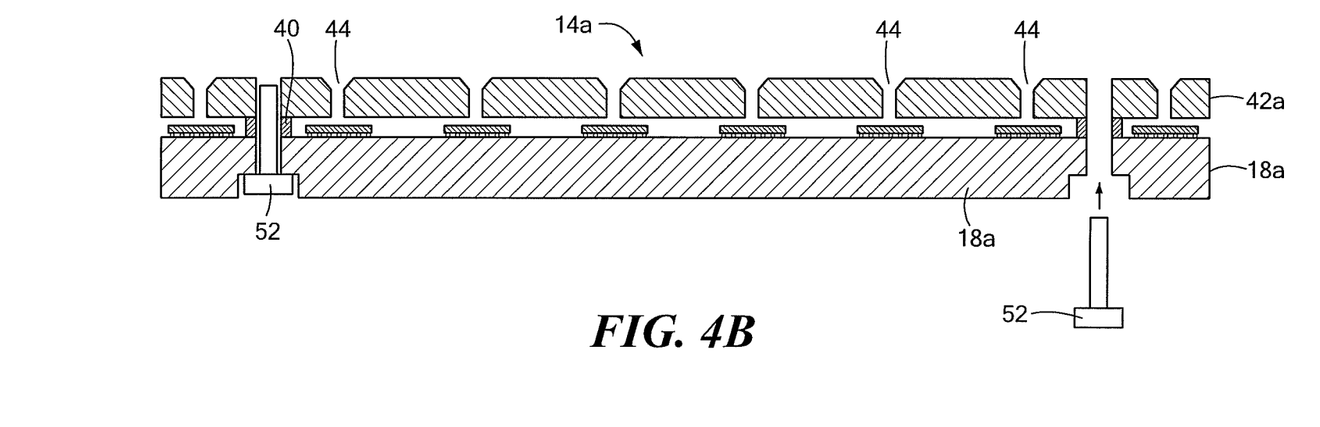
Figure 4C:
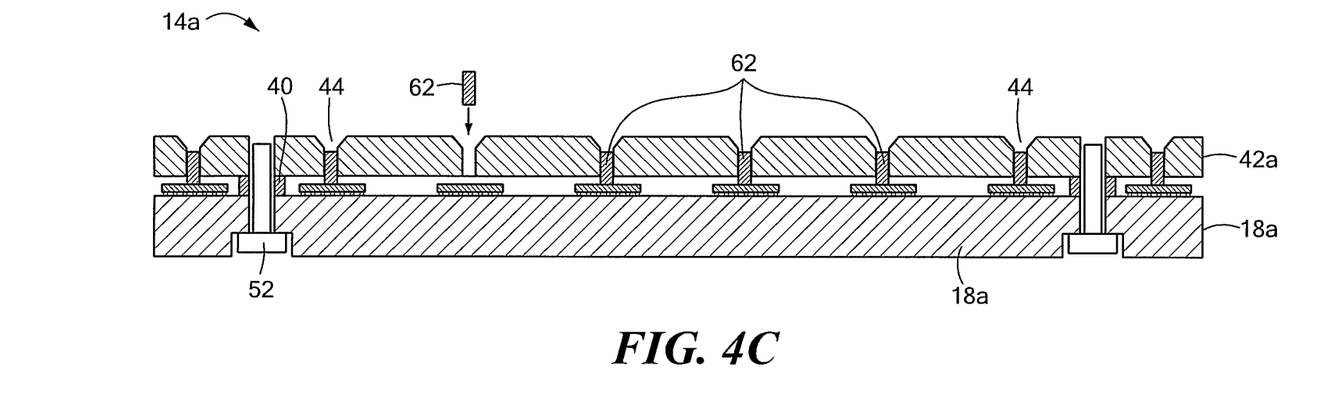

Thermally conductive material 62 is disposed within the bores 44 (FIG. 4C). In one example, the thermally conductive material 62 is a solder material that includes tin and/or lead, for example. In another example, the thermally conductive material 62 is a thermally conductive epoxy.

Figure 4D:
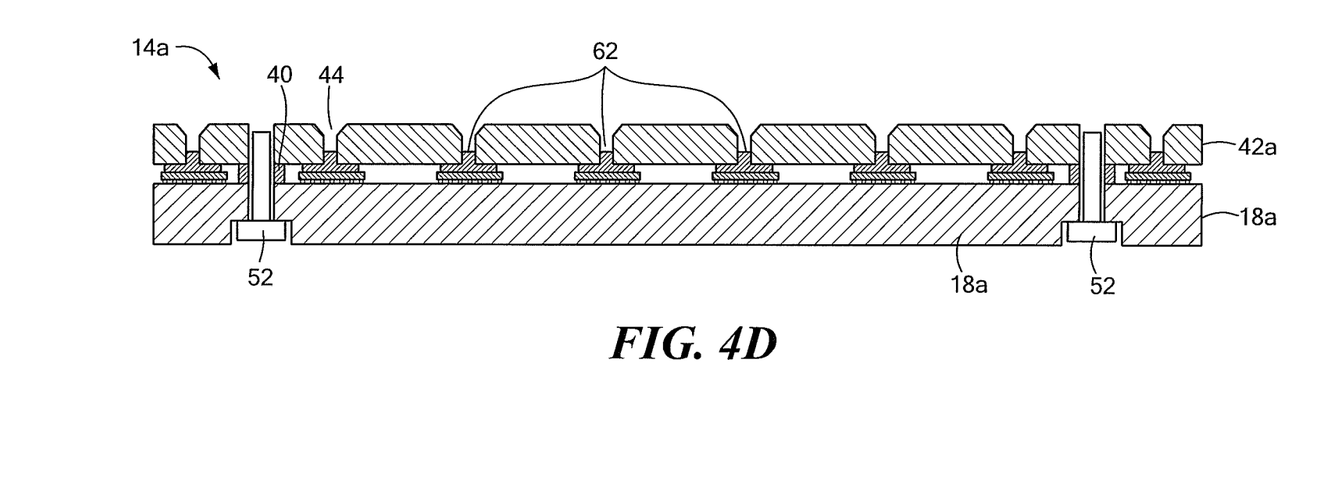

After the thermally conductive material 62 is heated, the thermally conductive material 62 melts and covers the top surface (e.g., the entire top surface) of the active circuit 35 (FIG. 4D). Surface tension of the thermally conductive material 62 prevents the thermally conductive material from overflowing the active circuit 35. The thermally conductive material 62 forms a thermally conductive path from the active circuits 35 to the cold plate 42a. In general, the amount of thermally conductive material 62 is selected so that none of the thermally conductive material protrudes from the top of the bores 44.

In one particular example, the cold plate 42a and the active panel 18a are selected such that their thermal coefficients of expansion (TCE) are substantially the same. By having similar TCE, the shearing forces that may exist in the x-direction and/or y-direction due to heating to high temperatures is minimized thereby preventing damage to the active circuits 35. In particular, if the active circuits 35 include a BGA assembly the active circuits 35 will not be separated from the solder balls by a force in the x-direction and/or y-direction. In one example, the cold plate 42a includes aluminum graphite material and the TCE is 10 ppm/° C. and the active panel 18a is a printed wiring board with a TCE of 12 ppm/° C. In one particular example, the cold plate 42a is tailored at specific locations near the active circuit 35 to have a TCE of approximately 4 to 7 ppm/° C. which is similar to the TCE of the active circuits 35.

Figure 5:
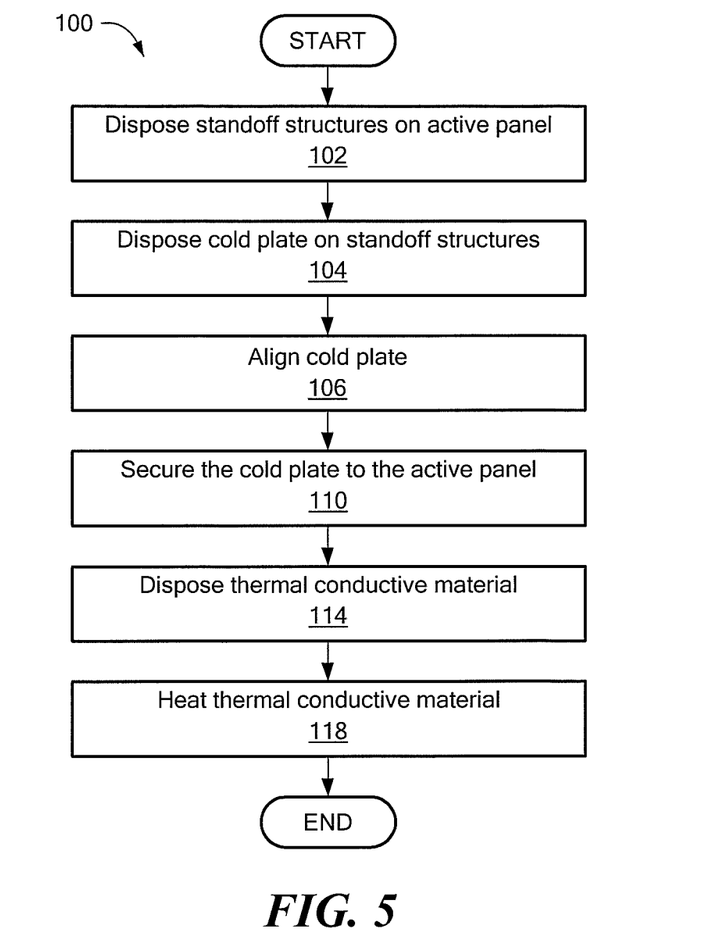
FIG. 5 is a flowchart of an example of a process to form the subassembly.

Referring to FIG. 5, one process to form the subassembly 14a is a process 100. The standoff structures 40 are disposed on the cold plate 42a (102). The cold plate 42a is disposed on the standoff structures 40 (104). In one example, one or more of the standoffs structures 40 are made out of the same material as the cold plate 42a. The cold plate 42a is aligned so that the bores 44 are over a corresponding one of the active circuits 35 (106). The cold plate 42a is secured to the active panel 18 using the fasteners 52 (110). Thermally conductive material 62 is disposed in the bores 44 (114). In one example, the thermally conductive material 62 are solder plugs. In another example, the thermally conductive material is a solder paste that is injected into the bores 44. The amount of thermally conductive material 62 selected for each bore 44 ensures that excess thermally conductive material does not overfill the bores.

The thermally conductive material 62 is heated (118). In one example, the thermally conductive material 62 liquefies at a low temperature (e.g., about 175° C.) but lower than the melting temperature (e.g., about 275° C.) of the BGA assembly 37.

Figure 6A:
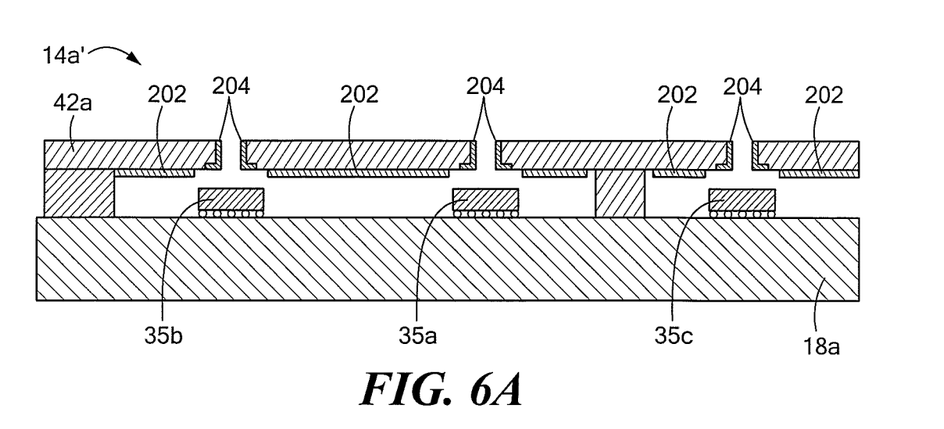
FIGS. 6A to 6C are views of another example of the formation of the subassembly with additional features.
Figure 6B:
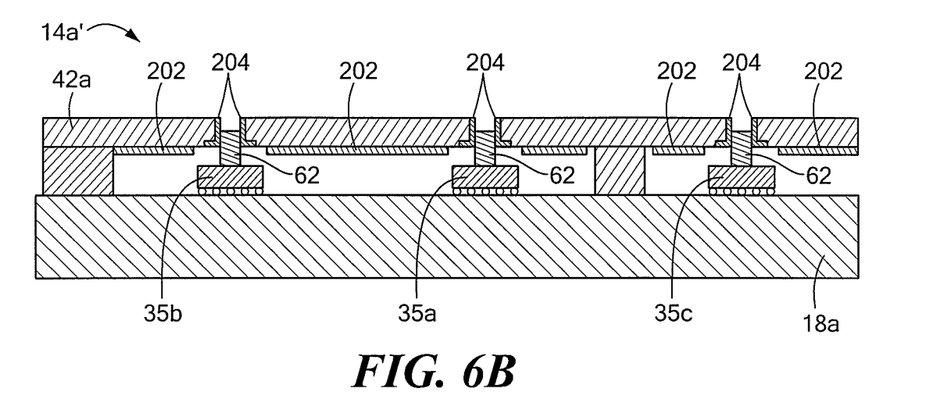
Figure 6C:
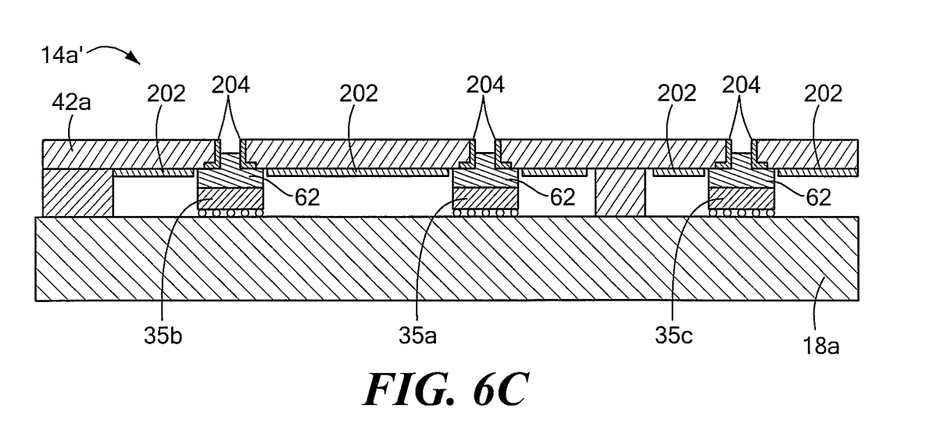

FIGS. 6A to 6C depict another example of forming the subassembly 14a as a subassembly 14a'. The subassembly 14a includes mask structures 202 and adherent structures 204. For example, as the thermally conductive material 62 is heated (e.g., as in processing block 118) the mask structures 202 contain the liquefied thermally conductive material 62. In one example, the mask structures 202 include materials that do not readily bond to the thermally conductive material 62. In one example, the masking structure 202 is a solder mask. The mask structures 202 prevent electrical shorts and ensure that the thermally conductive material 62 does not migrate to areas that are not desirable.

The adherent structures 204 (e.g., gold) are used to bond with the thermally conductive material 62. Thus, a thermally conductive path is formed from the active circuits 35 through the thermally conductive material 62 and through the adherent structures 204 to the cold plate 42a.

As seen in FIGS. 6A to 6C, the active circuits 35 may have various thicknesses, but the cold plate is able to thermally connect to all of the active circuits 35. For example, an active circuit 35a has a thickness $T_1$, an active circuit 35b has a thickness $T_2$ and an active circuit 35c has a thickness $T_3$ where $T_3>T_2>T_1$. In one example, the difference in thicknesses of at least two of the thicknesses, $T_3, T_2, T_1$ is greater than 1 mil (or 0.001 inches). One of ordinary skill in the art would recognize that other structures may be stacked on to the subassembly 14a while maintaining thermal cooling.

The processes described herein are not limited to the specific embodiments described. For example, the process 100 is not limited to the specific processing order of FIG. 5. Rather, any of the blocks of FIG. 5 may be re-ordered, combined or removed, as necessary, to achieve the results set forth above. In particular, the processing block of heating the thermally conductive material, processing block 118, may be removed if a thermally conductive material (e.g., an air cooled epoxy) is disposed through the bores 44 in a liquid state to cover the top surface of the active circuits 35 in processing block 114.

Elements of different embodiments described herein may be combined to form other embodiments not specifically set forth above. Other embodiments not specifically described herein are also within the scope of the following claims.

What is claimed is:

1. An assembly comprising:
a panel comprising a first surface;
a first active circuit coupled to the first surface of the panel;
a cold plate having a first bore and comprising:
a first inner surface exposed by the first bore; and
a second surface facing the first surface of the panel;
a first thermally conductive material in contact with the first inner surface of the cold plate and the first active circuit and forming a thermal conductive path from the first active circuit to the cold plate that extends only through the first thermally conductive material, the first thermally conductive material being in direct contact with the second surface of the cold plate; and
a mask layer in direct contact with the second surface of the cold plate, the mask layer being resistant to bonding to the first thermally conductive material, the mask layer not being part of the thermal conductive path,
wherein an opening of the bore is completely filled with only the first thermally conductive material.

2. The assembly of claim 1 wherein the cold plate has a second bore and the cold plate comprises a second inner surface exposed by the second bore, and further comprising;
a second active circuit coupled to the first surface of the panel; and
a second thermally conductive material in contact with the second inner surface of the cold plate and the first active circuit.

3. The assembly of claim 2 wherein the first active circuit and the second active circuit differ in thickness by more than 1 mil.

4. The assembly of claim 2 wherein the first thermally conductive material and the second thermally conductive material are composed of the same elements.

5. The assembly of claim 4 wherein the first thermally conductive material comprises one of lead and tin.

6. The assembly of claim 4 wherein the first thermally conductive material comprises a thermally conductive epoxy.

7. The assembly of claim 1, wherein the first inner surface comprises a gold layer, the gold layer extends from the first inner surface to a portion of the second surface of the cold plate.

8. The assembly of claim 1, further comprising:
a first standoff member in contact with the panel and the cold plate; and
a first fastener extending through the standoff and configured to secure the cold plate to the panel.

9. The assembly of claim 8, further comprising:
a second standoff member in contact with the panel and the cold plate; and
a second fastener extending through the standoff and configured to secure the cold plate to the panel;
a third standoff member in contact with the panel and the cold plate; and
a third fastener extending through the standoff and configured to secure the cold plate to the panel.

10. The assembly of claim 1 wherein the mask layer is a solder mask.

11. An active, electronically scanned array (AESA) panel architecture system comprising:
an antenna panel;
an active panel coupled to the antenna panel and comprising a first surface;
active circuits coupled to the first surface of the active panel;
a cold plate comprising:
bores;
inner surfaces exposed by the bores; and
second surface facing the first surface of the panel;
thermally conductive material in contact with the inner surfaces of the cold plate and the active circuits and forming thermal conductive paths from the active circuits to the cold plate that extend only through the thermally conductive material, the thermally conductive material being in direct contact with the second surface of the cold plate; and
a mask layer in direct contact with the second surface of the cold plate, the mask layer being resistant to bonding to the thermally conductive material, the mask layer not being part of the thermal conductive paths,
wherein a first active circuit of the active circuits and a second active circuit of the active circuits differ in thickness by more than 1 mil,
wherein openings of the bores are completely filled with only the thermally conductive material.

12. The system of claim 11 wherein the thermally conductive material comprises one of lead and tin.

13. The system of claim 12, wherein the inner surfaces of the cold plate comprise a gold layer, each gold layer extends from the inner surface to a portion of the second surface of the cold plate.

14. The system of claim 11, further comprising:
   standoff members in contact with the active panel and the cold plate; and
   fasteners extending through the standoff and configured to secure the cold plate to the active panel.

15. The system of claim 11 wherein the mask layer is a solder mask.

* * * * *